(12) United States Patent
Yamazaki et al.

(10) Patent No.: US 9,093,601 B2
(45) Date of Patent: Jul. 28, 2015

(54) PHOTOELECTRIC CONVERSION DEVICE

(75) Inventors: Shunpei Yamazaki, Tokyo (JP); Fumito Isaka, Kanagawa (JP); Jiro Nishida, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 611 days.

(21) Appl. No.: 13/398,877

(22) Filed: Feb. 17, 2012

(65) Prior Publication Data

US 2012/0211081 A1 Aug. 23, 2012

(30) Foreign Application Priority Data

Feb. 21, 2011 (JP) .................................. 2011-034621

(51) Int. Cl.
| | | |
|---|---|---|
| H01L 31/00 | (2006.01) | |
| H01L 31/18 | (2006.01) | |
| H01L 31/074 | (2012.01) | |
| H01L 31/075 | (2012.01) | |
| H01L 31/0224 | (2006.01) | |

(52) U.S. Cl.
CPC .......... *H01L 31/1868* (2013.01); *H01L 31/074* (2013.01); *H01L 31/075* (2013.01); *H01L 31/1804* (2013.01); *H01L 31/022466* (2013.01); *Y02E 10/547* (2013.01); *Y02E 10/548* (2013.01); *Y02E 10/549* (2013.01)

(58) Field of Classification Search
USPC .................................................. 136/255, 256
See application file for complete search history.

(56) References Cited

U.S. PATENT DOCUMENTS

| | | | | |
|---|---|---|---|---|
| 4,542,578 | A | * | 9/1985 | Yamano et al. ................. 438/80 |
| 5,213,628 | A | | 5/1993 | Noguchi et al. |
| 6,133,119 | A | | 10/2000 | Yamazaki |
| 7,517,470 | B2 | | 4/2009 | Seo et al. |
| 7,554,031 | B2 | * | 6/2009 | Swanson et al. ............. 136/261 |
| 7,888,167 | B2 | * | 2/2011 | Yamazaki et al. ............. 438/96 |
| 2007/0008257 | A1 | | 1/2007 | Seo et al. |
| 2008/0157283 | A1 | * | 7/2008 | Moslehi ......................... 257/618 |
| 2010/0006147 | A1 | * | 1/2010 | Nakashima et al. .......... 136/256 |
| 2010/0207518 | A1 | | 8/2010 | Ikeda et al. |
| 2010/0269896 | A1 | * | 10/2010 | Sheng et al. .................. 136/255 |

FOREIGN PATENT DOCUMENTS

| | | |
|---|---|---|
| JP | 04-130671 | 5/1992 |
| JP | 07-130661 | 5/1995 |
| JP | 10-135497 | 5/1998 |

\* cited by examiner

*Primary Examiner* — Eli Mekhlin
(74) *Attorney, Agent, or Firm* — Nixon Peabody LLP; Jeffrey L. Costellia

(57) ABSTRACT

An object is to provide a photoelectric conversion device which has little loss of light absorption in a window layer and has high conversion efficiency. A photoelectric conversion device including a crystalline silicon substrate having n-type conductivity and a light-transmitting semiconductor layer having p-type conductivity between a pair of electrodes is formed. In the photoelectric conversion device, a p-n junction is formed between the crystalline silicon substrate and the light-transmitting semiconductor layer, and the light-transmitting semiconductor layer serves as a window layer. The light-transmitting semiconductor layer includes an organic compound and an inorganic compound. As the organic compound and the inorganic compound, a material having a high hole-transport property and a transition metal oxide having an electron-accepting property are respectively used.

19 Claims, 11 Drawing Sheets

PHOTOELECTRIC CONVERSION DEVICE

BACKGROUND OF THE INVENTION

1. Field of the Invention

The present invention relates to a photoelectric conversion device including a window layer formed using an organic compound and an inorganic compound.

2. Description of the Related Art

Recently, a photoelectric conversion device that generates power without carbon dioxide ejection has attracted attention as a countermeasure against global warming. As typical examples thereof, solar cells which use crystalline silicon substrates such as single crystalline and polycrystalline silicon substrates have been known.

In solar cells using a crystalline silicon substrate, a structure having so-called homo junction is widely used. In such a structure, a layer having the conductivity type opposite to that of the crystalline silicon substrate is formed on one surface side of the crystalline silicon substrate by diffusion of impurities.

Alternatively, a structure with hetero junction in which amorphous silicon having different optical band gap and conductivity type from those of a crystalline silicon substrate is formed on one surface side of the crystalline silicon substrate is known (see Patent Documents 1 and 2).

REFERENCE

[Patent Document 1] Japanese Published Patent Application No. H04-130671
[Patent Document 2] Japanese Published Patent Application No. H10-135497

SUMMARY OF THE INVENTION

In the above photoelectric conversion device, since crystalline silicon or amorphous silicon is used for a window layer, the light loss due to light absorption in the window layer is caused.

Although photo-carriers are generated also in the window layer, minority carriers are likely to be recombined in the window layer; thus, photo-carriers taken out as current are almost generated on a back electrode side in the crystalline silicon substrate, which is the opposite side of the p-n junction. That is, light absorbed in the window layer is not substantially utilized, and accordingly, the window layer is preferably formed using a material having a light-transmitting property with respect to light in a wavelength range where crystalline silicon has optical sensitivity.

Thus, an object of one embodiment of the present invention is to provide a photoelectric conversion device which has little light loss caused by light absorption in the window layer.

One embodiment of the present invention disclosed in this specification relates to a photoelectric conversion device including a window layer which is formed using an organic compound and an inorganic compound and having high passivation effect on a silicon surface.

One embodiment of the present invention disclosed in this specification is a photoelectric conversion device including, between a pair of electrodes, a crystalline silicon substrate and a light-transmitting. Semiconductor layer in contact with the crystalline silicon substrate. The light-transmitting semiconductor layer includes an organic compound and an inorganic compound.

The conductivity type of the crystalline silicon substrate is n-type, and the conductivity type of the light-transmitting semiconductor layer is p-type.

Further, a light-transmitting conductive film may be formed over the light-transmitting semiconductor layer.

Another embodiment of the present invention disclosed in this specification is a photoelectric conversion device including, between a pair of electrodes, a crystalline silicon substrate, a first amorphous silicon layer in contact with one of surfaces of the crystalline silicon substrate, a light-transmitting semiconductor layer in contact with the first amorphous silicon layer, a second amorphous silicon layer in contact with the other surface of the crystalline silicon substrate, and a silicon semiconductor layer in contact with the second, amorphous silicon layer. The light-transmitting semiconductor layer includes an organic compound and an inorganic compound.

Note that the ordinal numbers such as "first" and "second" in this specification, etc. are assigned in order to avoid confusion among components, but not intended to limit the number or order of the components.

Another embodiment of the present invention disclosed in this specification is a photoelectric conversion device including, between a pair of electrodes, a crystalline silicon, substrate, a light-transmitting semiconductor layer in contact with one of surfaces of the crystalline silicon substrate, an amorphous silicon layer in contact with the other surface of the crystalline silicon substrate, and a silicon semiconductor layer in contact with the amorphous silicon layer. The light-transmitting semiconductor layer includes an organic compound and an inorganic compound.

The conductivity types of the crystalline silicon substrate and the silicon semiconductor layer are preferably n-type, the conductivity type of the light-transmitting semiconductor layer is preferably p-type, and the conductivity type of the amorphous silicon layer is preferably i-type.

Further, a light-transmitting conductive film may be provided in contact with the light-transmitting semiconductor layer.

In the photoelectric conversion device according to one embodiment of the present invention, an oxide of a metal belonging to any of Group 4 to Group 8 of the periodic table can be used as the inorganic compound. Specifically, vanadium oxide, niobium oxide, tantalum oxide, chromium oxide, molybdenum oxide, tungsten oxide, manganese oxide, rhenium oxide, or the like can be used.

As the organic compound, any of an aromatic amine compound, a carbazole derivative, aromatic hydrocarbon, a high molecular compound, and a heterocyclic compound having a dibenzofuran skeleton or a dibenzothiophene skeleton can be used.

With use of one embodiment of the present invention, a photoelectric conversion device which can reduce the light loss caused by light absorption in the window layer and has high conversion efficiency can be provided.

DETAILED DESCRIPTION OF THE INVENTION

Figure 1A:
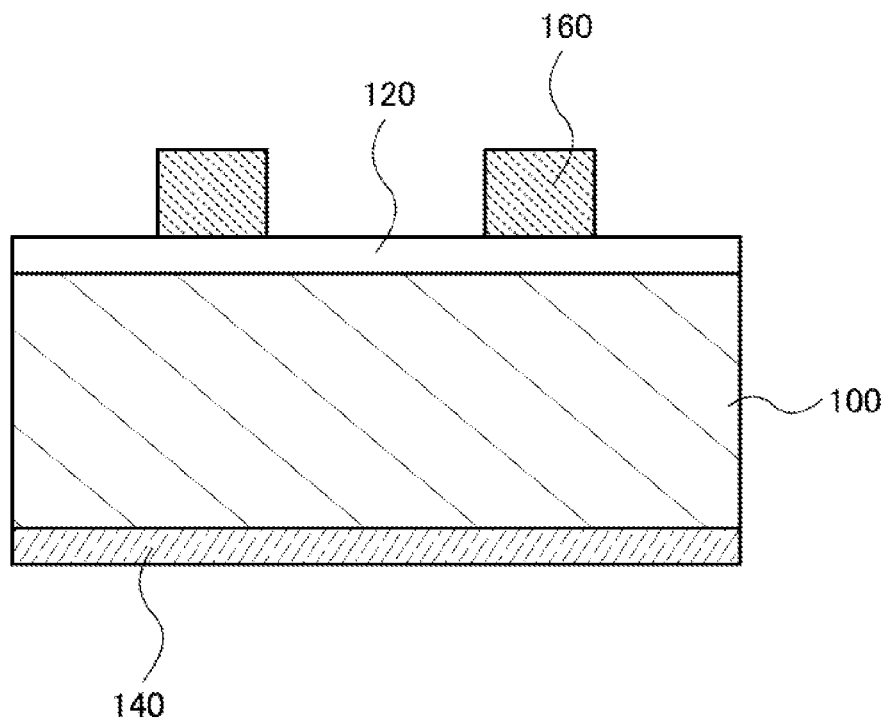
FIGS. 1A and 1B are cross-sectional views each illustrating a photoelectric conversion device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

Embodiment 1

In this embodiment, a photoelectric conversion device according to one embodiment of the present invention and a manufacturing method thereof will be described.

FIG. 1A is a cross-sectional view of a photoelectric conversion device according to one embodiment of the present invention. The photoelectric conversion device includes a crystalline silicon substrate 100, a light-transmitting semiconductor layer 120 and a first electrode 140 which are in contact with the crystalline silicon substrate, and a second electrode 160 in contact with the light-transmitting semiconductor layer 120. Note that the second electrode 160 is a grid electrode, and the surface on which the second electrode 160 is formed serves as a light-receiving surface.

Figure 1B:
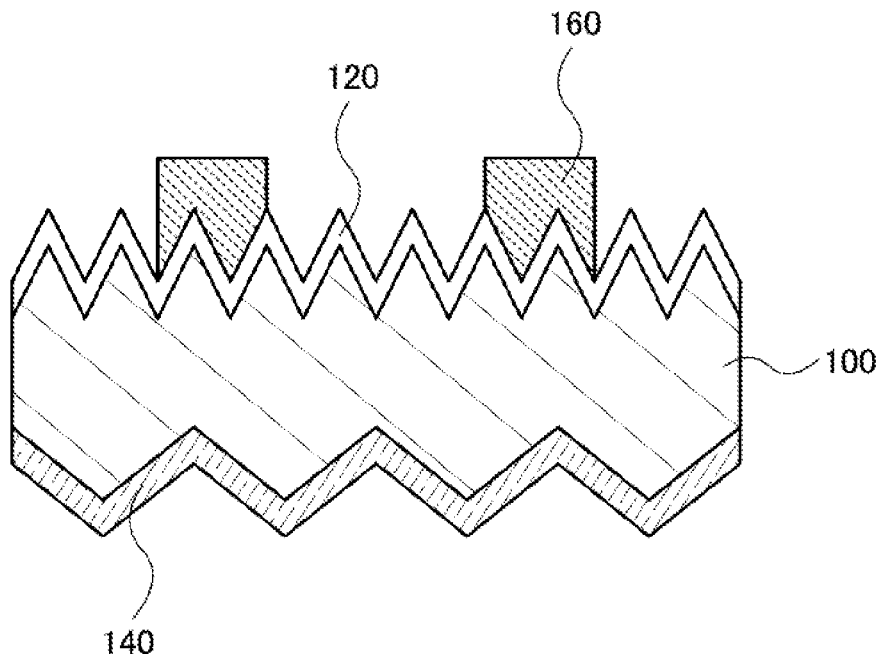

FIG. 1B illustrates an example in which a surface (front surface) and the back surface (rear surface) of the crystalline silicon substrate 100 are processed to have unevenness in a stacked structure similar to that of FIG. 1A. On the surface processed to have unevenness, multiply-reflected light is incident, and the light obliquely propagates into a photoelectric conversion region; thus, the light pass length is increased. In addition, a so-called light trapping effect in which reflected light by the back surface is totally reflected at the surface can occur. Further, when the surface serving as a light-receiving surface is processed to have unevenness such that the distance between projecting portions or depressed portions is several tens of nanometers to several hundreds of nanometers, the reflectance of light with a wavelength in the range of 300 nm to 1200 nm can be suppressed to be 5% or lower; thus, high anti-reflection effect can be, given. Note that the structure is not limited to that illustrated in FIG. 1B. A structure in which one of surfaces (a surface and the back surface) is processed to have unevenness may be employed. Alternatively, a structure in which the surface and the back surface are processed to have the same unevenness shape may be employed.

The crystalline silicon substrate 100 has one conductivity type, and the light-transmitting semiconductor layer 120 is a layer having the opposite conductivity type to that of the crystalline, silicon substrate 100. Thus, a p-n junction is formed at an interface between the crystalline silicon substrate 100 and the light-transmitting semiconductor layer 120. Here, since the light-transmitting semiconductor layer 120 according to one embodiment, of the present invention has p-type conductivity, as the crystalline silicon substrate 100, a crystalline silicon substrate having n-type conductivity is used.

Although not illustrated, between the crystalline silicon substrate 100 and the first electrode 140, a layer having the same conductivity as the crystalline silicon substrate 100 and having higher carrier density than the crystalline silicon substrate 100 may be provided as a back surface field (BSF) layer. In this embodiment, when an $n^+$ layer is provided as the BSF layer, an $n-n^+$ junction is formed, and minority carriers are repelled by the electric field of the $n-n^+$ junction and attracted to the p-n junction side, whereby recombination of carriers in the vicinity of the first electrode 140 can be prevented.

The light-transmitting semiconductor layer 120 in one embodiment of the present invention is formed using a composite-material of an inorganic compound and an organic compound. As the inorganic compound, transition metal oxide can be used. Among the transition metal oxide, an oxide of a metal belonging to any of Groups 4 to 8 in the periodic table is particularly preferable. Specifically, vanadium oxide, niobium oxide, tantalum oxide, chromium oxide, molybdenum oxide, tungsten oxide, manganese oxide, rhenium oxide, or the like can be used. Among these, molybdenum oxide is especially preferable since it is stable in the air, has low hygroscopic property, and is easily treated.

As the organic compound, a variety of compounds such as an aromatic amine compound, a carbazole derivative, an aromatic hydrocarbon, a high molecular compound (such as an oligomer, a dendrimer, or a polymer), and heterocyclic compounds having a dibenzofuran skeleton or a dibenzothiophene skeleton can be used. Note that the organic compound used for the composite, material is preferably an organic compound having a high hole-transport property. Specifically, a substance having a hole mobility of $10^{-6}$ $cm^2$/Vs or higher is preferably used. However, other substances than the above described materials may also be used as, long as the substances have higher hole-transport properties than electron-transport properties.

The transition metal oxide has an electron-accepting property. A composite material of an organic compound having a high hole-transport property and such a transition metal has high carrier density and exhibits p-type semiconductor characteristics. The composite material has high transmittance of light in a wide wavelength range from visible light region to infrared region.

The composite material is stable, and silicon oxide is not generated at an interface between the crystalline silicon substrate and the composite material; thus, defects at the interface can be reduced, resulting in improvement in lifetime of carriers.

In the case where the composite material is formed as a passivation film on both of surfaces (a surface and a back surface) of an n-type single crystal silicon substrate, the following has been confirmed by the experiment: the lifetime of carriers is 700 μsec or more when 4-phenyl-4'-(9-phenylfluoren-9-yl)triphenylamine (abbreviation: BPAFLP) and molybdenum(VI) oxide are used as the organic compound and the inorganic compound respectively; the lifetime, of carriers is 400 μsec or more when 4,4'-bis[N-(1-naphthyl)-N-phenylamino]biphenyl (abbreviation: NPB) and molybdenum(VI) oxide are used as the organic compound and the inorganic compound respectively. Note that the lifetime of carriers in the case where an n-type single crystal silicon substrate is not provided with a passivation film is about 40 μsec, and the lifetime of carriers in the case where indium tin oxide (ITO) is formed on both of surfaces of the single crystal silicon substrate by a sputtering method is about 30 μsec.

In the conventional photoelectric conversion devices, since an impurity layer formed on a surface layer of a crystalline silicon substrate functions as a window layer, the window layer has a light absorption property which is almost equivalent to that of a light absorption region on the back electrode side which is the opposite side of the window layer. Although photo-carriers are generated also in the window layer, the lifetime of minority carriers is short and the carriers cannot be taken out as current. Thus, the light absorption in the window layer is a heavy loss in the conventional photoelectric conversion devices.

In one embodiment of the present invention, the above-described composite material is used for the window layer of the photoelectric conversion device in which an n-type crystalline silicon substrate is used as a light absorption layer, whereby light absorption in the window layer is reduced, and photoelectric conversion can be efficiently performed in the light absorption region. Further, as described above, the composite material has extremely high passivation effect on the silicon surface. Accordingly, the photoelectric conversion efficiency of the photoelectric conversion device can be improved.

Further, although not illustrated, over the light-transmitting semiconductor layer 120, a light-transmitting insulating film may be provided in a region other than the connection region with the second electrode 160. Providing the light-transmitting insulating film enables the surface defect of the light-transmitting semiconductor layer 120 to be reduced. As the light-transmitting insulating film, a silicon oxide film or a silicon nitride film formed by a plasma CVD method or a sputtering method can be used.

Figure 2:
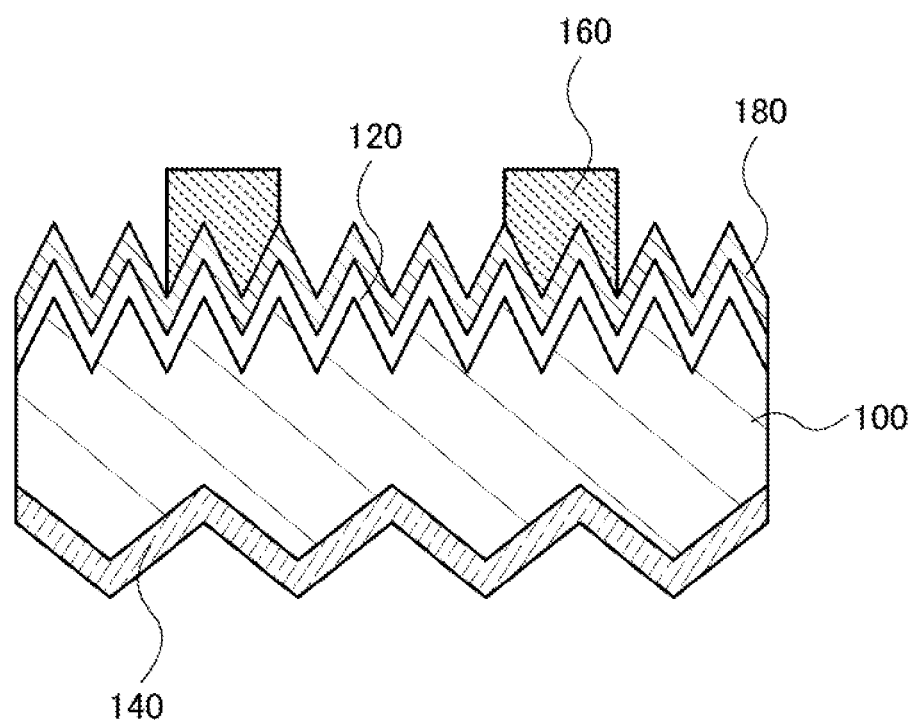
FIG. 2 is a cross-sectional view illustrating a photoelectric conversion device according to one embodiment of the present invention.

FIG. 2 illustrates an example of a structure obtained by providing a light-transmitting conductive film 180 between the light-transmitting semiconductor layer 120 and the second electrode 160 in the structure of FIG. 1B. Providing the light-transmitting conductive film in this manner enables resistance loss in the light-transmitting semiconductor layer 120 to be reduced.

Note that in each of the structures of the photoelectric conversion devices in FIGS. 1A and 1B and FIG. 2, a region illustrated as the light-transmitting semiconductor layer 120 may be a stacked stricture of a light-transmitting semiconductor layer and a p-type silicon semiconductor layer. When the p-type silicon semiconductor layer is provided, the carrier density in a p-type region (a stacked portion of the light-transmitting semiconductor layer and the p-type silicon semiconductor layer) can be increased. As a result, the internal electric field can be increased, and the electric characteristics of the photoelectric conversion device can be improved. Note that the p-type silicon semiconductor layer used here can be formed to have extremely small thickness; thus, the light loss caused by light absorption can be almost ignored.

Next, a method for manufacturing the photoelectric conversion device illustrated in FIG. 1B is described with reference to FIGS. 7A to 7C and FIGS. 8A to 8C.

A single crystal silicon substrate or a polycrystalline, silicon substrate, which has n-type conductivity, can be used for the crystalline silicon substrate 100 which can be used in one embodiment of the present invention. The manufacturing method of the crystalline silicon substrate is not specifically limited. In this embodiment, a single crystal silicon substrate whose surface corresponds to the (100) plane and which is manufactured by a Magnetic Czochralski (MCZ) method is used (see FIG. 7A).

Next, the surface and the back surface of the crystalline silicon substrate 100 are subjected to a process for forming unevenness. First, with use of an alkaline etchant (e.g., a 10% aqueous solution of potassium hydroxide), the surface and the back surface of the crystalline silicon substrate 100 are etched. In this embodiment, since the single crystal silicon substrate whose surface corresponds to the (100) plane is used, first unevenness 210 can be formed in the surface and the back surface of the crystalline silicon substrate 100 by utilizing a difference in etching rates between the (100) plane and the (111) plane (see FIG. 7B). In this step, one surface side where a light-receiving surface is to be formed may be covered with a resist mask, so that the first unevenness 210 may be formed only in the other surface side. Note that with a method using an alkali etchant, projecting portions each having an aspect ratio greater than or equal to 0.5 and less than or equal to 3 can be formed with a distance of from 2 μm to 10 μm inclusive.

Next, by a dry etching method, second unevenness 220 which is finer than the first unevenness 210 is formed on the surface side where a light-receiving surface is to be formed. For example, the crystalline silicon may be etched with use of a fluorocarbon-based gas and a chlorine-based gas in a RIE mode. Specifically, the projecting portions each having an aspect ratio greater than or equal to 3 and less than or equal to 15 can be formed with a distance of from 60 nm to 500 nm inclusive. Note that in a dry etching method, etching uniformly proceeds regardless of plane orientation. Thus, in the case of using a polycrystalline silicon substrate as the crystalline silicon substrate 100, it is preferable that a dry etching method be employed for forming unevenness in the surface and the back surface. Note that the above processing method for forming unevenness is just an example, and the processing method for forming unevenness is not limited to the above.

Figure 8A:
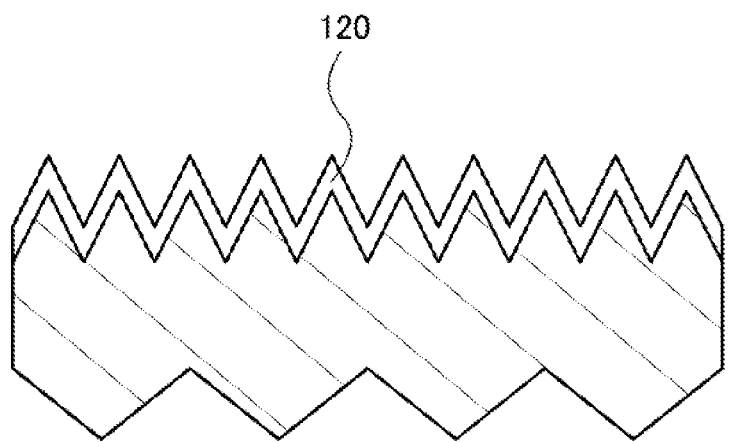
FIGS. 8A to 8C are cross-sectional views illustrating a process of a manufacturing method of a photoelectric conversion device according to one embodiment of the present invention.

Next, the light-transmitting semiconductor layer 120 is formed on the one surface side of the crystalline silicon substrate 100, where a light-receiving surface is to be formed (see FIG. 8A). The light-transmitting semiconductor layer 120 is formed by co-deposition of the above-described inorganic compound and the above-described organic compound. A co-deposition method is a method in which vapor deposition from a plurality of evaporation sources is performed at the same time in one deposition chamber. It is preferable that deposition be performed under high vacuum. The high vacuum can be obtained by evacuation of the deposition chamber with an evacuation unit to a vacuum of about $5 \times 10^{-3}$ Pa or less, preferably, about $10^{-4}$ Pa to $10^{-6}$ Pa.

In this embodiment, the light-transmitting semiconductor layer 120 is formed by co-depositing 4-phenyl-4'-(9-phenylfluoren-9-yl)triphenylamine (abbreviation: BPAFLP) and molybdenum(VI) oxide. The thickness of the light-transmitting semiconductor layer 120 is set to 50 nm, and the weight ratio of BPAFLP to molybdenum oxide is controlled to be 2:1 (=BPAFLP:molybdenum oxide).

Note that in the case of providing a BSF layer (n$^+$ layer), dopant imparting n-type conductivity (such as phosphorus, arsenic, or antimony) may be dispersed on the other surface side of the crystalline silicon substrate 100, which is to be a back surface side, at high concentration before the light-transmitting semiconductor layer 120 is formed.

Figure 8B:
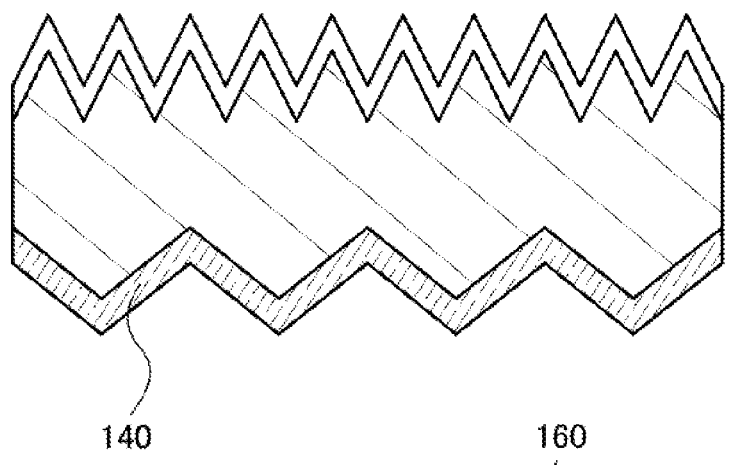

Next, the first electrode 140 is formed on the other surface side of the crystalline silicon substrate 100, which is to be a back surface side (see FIG. 8B). The first electrode 140 can be formed using a low resistance metal such as silver or copper by a sputtering, method, a vacuum evaporation method, or the like. Alternatively, the first electrode 140 may be formed using a conductive resin such as a silver paste or a copper paste by a screen printing method.

Figure 8C:
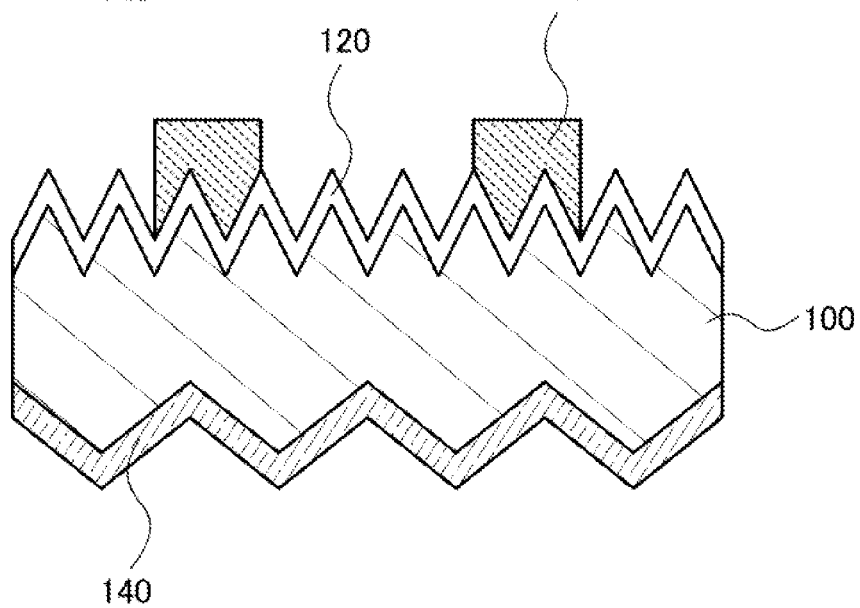

Next, the second electrode 160 is formed, over the light-transmitting semiconductor layer 120 (see FIG. 8C). The second electrode 160 is a grid electrode, which is preferably formed using a conductive resin such as a silver paste, a copper paste, a nickel paste, or a molybdenum paste by a screen printing method. Further, the second electrode 160 may be a stacked layer of different materials, such as a stacked layer of a silver paste and a copper paste.

Note that in order to form the photoelectric conversion device illustrated in FIG. 2, the light-transmitting conductive film 180 may be formed over the light-transmitting semiconductor layer 120 before the second electrode 160 is formed. For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The above light-transmitting conductive film is not limited to a single layer, and a stacked structure of different films may be employed. For example, a stacked layer of an indium tin oxide and a zinc oxide containing aluminum, a stacked layer of an indium tin oxide and a tin oxide containing fluorine, etc. can be used. A total film thickness is to be from 10 nm to 1000 nm inclusive.

In the above manner, the photoelectric conversion device in which the light-transmitting semiconductor layer is used as a window layer, which is one embodiment of the present invention, can be manufactured.

This embodiment can be freely combined with any of other embodiments.

Embodiment 2

In this embodiment, a photoelectric conversion device which has a different structure from that of the photoelectric conversion device described in Embodiment 1 and a manufacturing method thereof will be described.

Figure 3A:
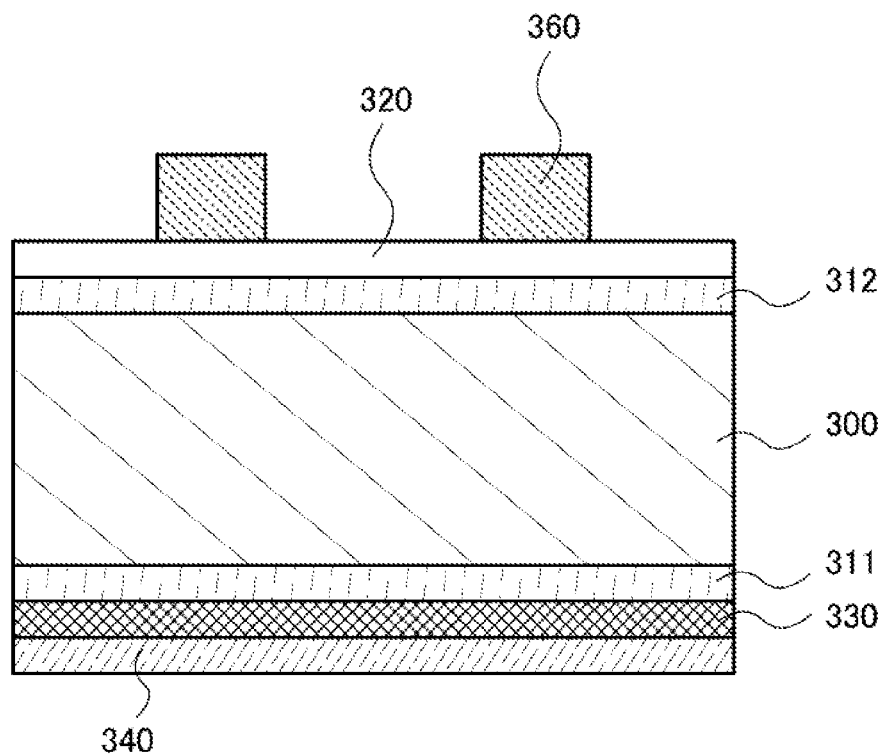
FIGS. 3A and 3B are cross-sectional views each illustrating a photoelectric conversion device according to one embodiment of the present invention.
Figure 3B:
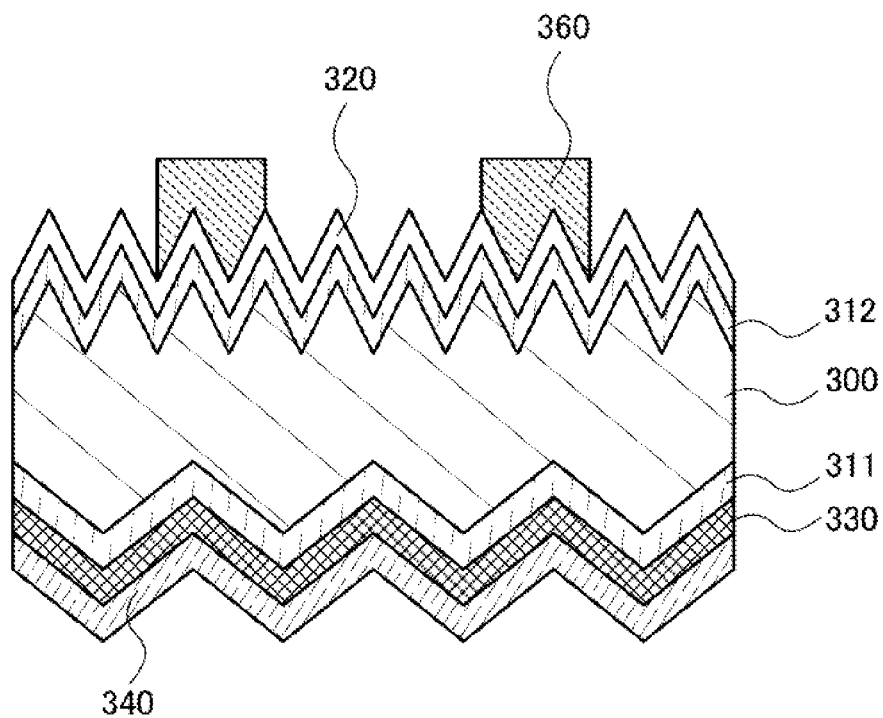

FIGS. 3A and 3B each illustrate a cross-sectional view of a photoelectric conversion device according to one embodiment of the present invention.

The photoelectric conversion device illustrated in FIG. 3A includes a crystalline silicon substrate 300, a first amorphous silicon layer 311 and a second amorphous silicon layer 312 which are in contact with the crystalline silicon substrate 300, a light-transmitting semiconductor layer 320 in contact with the second amorphous silicon layer 312, a silicon semiconductor layer 330 in contract with the first amorphous silicon layer 311, a first electrode 340 in contact with; the silicon semiconductor layer 330, and a second electrode 360 in contact with the light-transmitting semiconductor layer 320. Note that a surface where the second electrode 360 is formed functions as a light-receiving surface.

FIG. 3B illustrates an example in which a surface (front surface) and the back surface (rear surface) of the crystalline silicon substrate 300 are processed to have unevenness in a stacked structure similar to that of FIG. 3A. The description in Embodiment 1 can be referred to for the details of the effect obtained by the process for forming unevenness.

Here, the first amorphous silicon layer 311 and the second amorphous silicon layer 312 are high-quality i-type semiconductor layers with few defects and can terminate defects on the surface of the crystalline silicon substrate. Note that in this specification, an "i-type semiconductor" refers to not only a so-called intrinsic semiconductor in which the Fermi level lies in the middle of the band gap, but also a semiconductor in which the concentration of an impurity imparting p-type or n-type conductivity is $1 \times 10^{20}$ cm$^{-3}$ or lower and the photoconductivity is 100 times or more as high as the dark conductivity. This i-type silicon semiconductor may include an element belonging to Group 13 or Group 15 of the periodic table as an impurity element.

The crystalline silicon substrate 300 has one conductivity type, and the light-transmitting semiconductor layer 320 is a layer having the opposite conductivity type to that of the crystalline silicon substrate 300. Thus, a p-n junction is formed at the interface between the crystalline silicon substrate 300 and the light-transmitting semiconductor layer 320 with the second amorphous silicon layer 312 positioned therebetween. Here, the light-transmitting semiconductor layer 320 in one embodiment of the present invention has p-type conductivity, and as the crystalline silicon substrate 300, a crystalline silicon substrate having n-type conductivity is used.

The silicon semiconductor layer 330 provided on the back surface side has n$^+$-type conductivity, and thus an n-n$^+$ junction is formed in a state where the first amorphous silicon layer 311 is positioned between the silicon semiconductor layer 330 and the crystalline silicon substrate 300. That is, the silicon semiconductor layer 330 functions as a BSF layer.

The light-transmitting semiconductor layer 320 is formed using a composite material of an inorganic compound and an organic compound. For the inorganic compound and the organic compound, Embodiment 1 can be referred to.

In one embodiment of the present invention, the composite material is used for a window layer of the photoelectric conversion device in which the n-type crystalline silicon substrate serves as a light absorption layer, whereby the light loss caused by light absorption in the window layer is reduced, and photoelectric conversion can be efficiently performed in the light absorption layer. Accordingly, the photoelectric conversion efficiency of the photoelectric conversion device can be improved.

Figure 4:
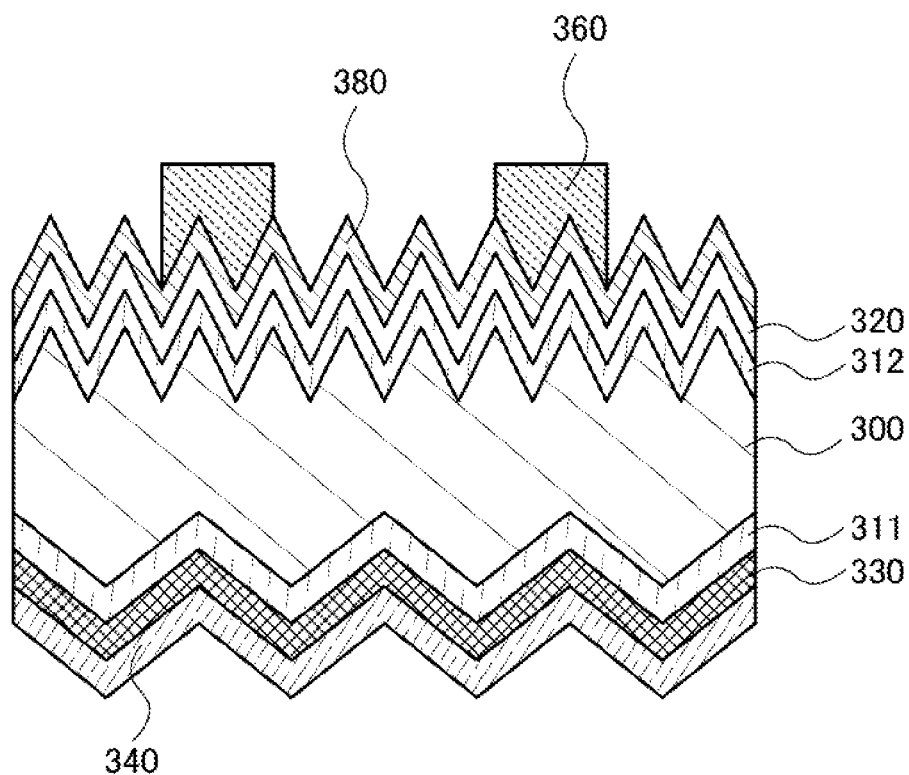
FIG. 4 is a cross-sectional view illustrating a photoelectric conversion device according to one embodiment of the present invention.

Further, as illustrated in FIG. 4, a light-transmitting conductive film 380 may be provided between the light-transmitting semiconductor layer 320 and the second electrode 360 in the structure of FIG. 3B. Providing the light-transmitting conductive film 380 enables the resistance loss in the light-transmitting semiconductor layer 320 to be reduced. Note that FIG. 4 illustrates a structure in which the crystalline silicon substrate 300 has unevenness; however, a structure without unevenness may be employed.

Figure 5:
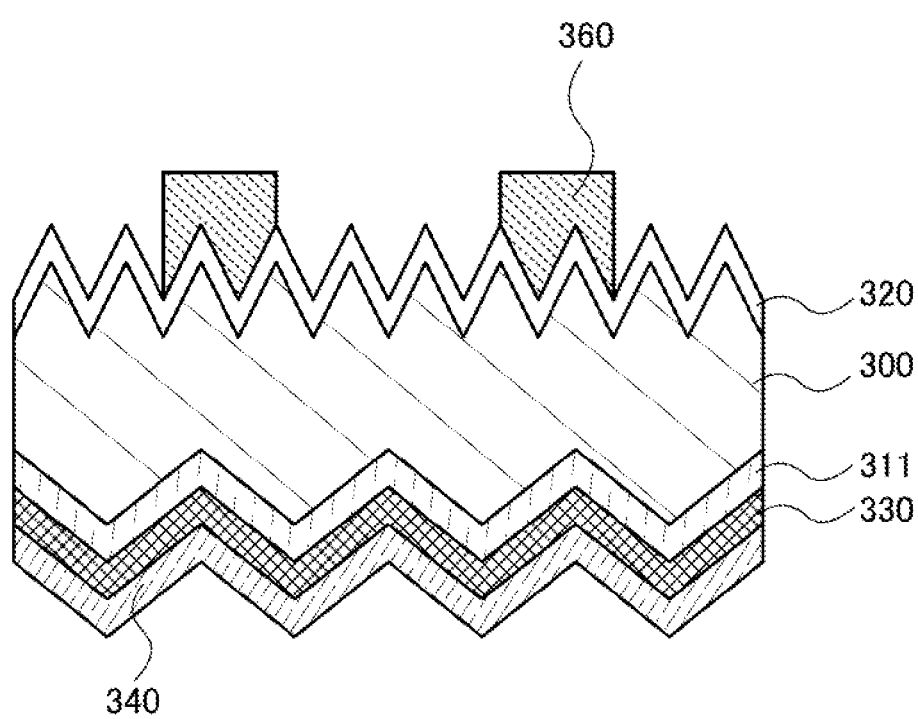
FIG. 5 is a cross-sectional view illustrating a photoelectric conversion device according to one embodiment of the present invention.

Alternatively, as illustrated in FIG. 5, the second amorphous silicon layer 312 may be eliminated from the structure of FIG. 3B, so that the crystalline silicon substrate 300 and the light-transmitting semiconductor layer 320 are in direct contact with each other and a p-n junction may be formed. The composite material of a transition metal oxide and an organic compound which can be used for the light-transmitting semiconductor layer 320 has high passivation effect. Thus, very few defects are generated at the junction interface between the crystalline silicon substrate and the light-transmitting semiconductor layer, and a favorable interface can be formed. Note that FIG. 5 illustrates a structure in which the crystalline silicon substrate 300 has unevenness; however, a structure without unevenness may be employed.

Figure 6:
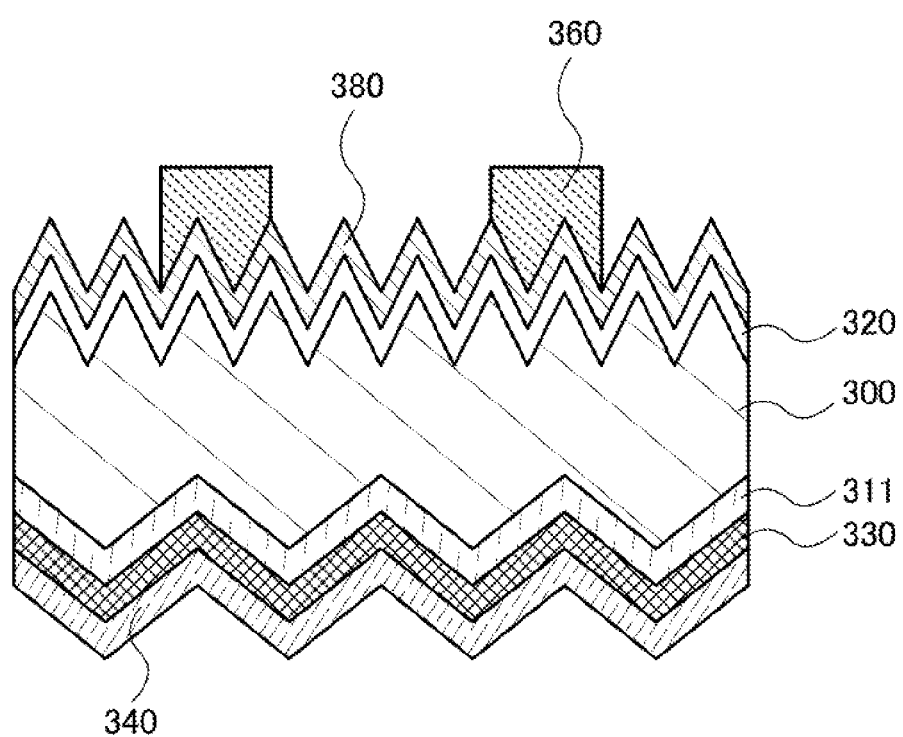
FIG. 6 is a cross-sectional view illustrating a photoelectric conversion device according to one embodiment of the present invention.
Figure 7A:
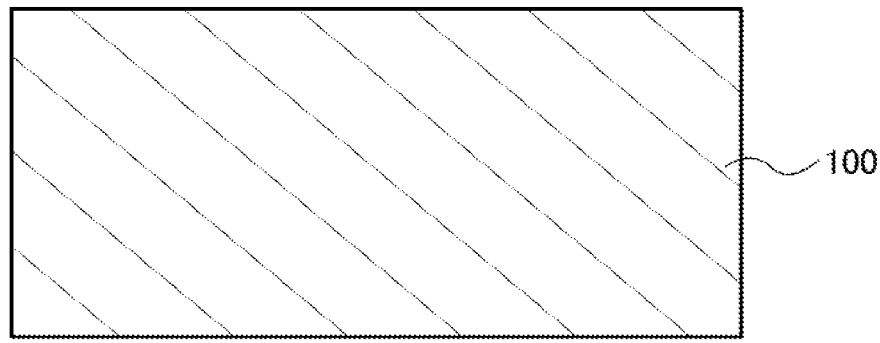
FIGS. 7A to 7C are cross-sectional views illustrating a process of a manufacturing, method of a photoelectric conversion device according to one embodiment of the present invention.
Figure 7B:
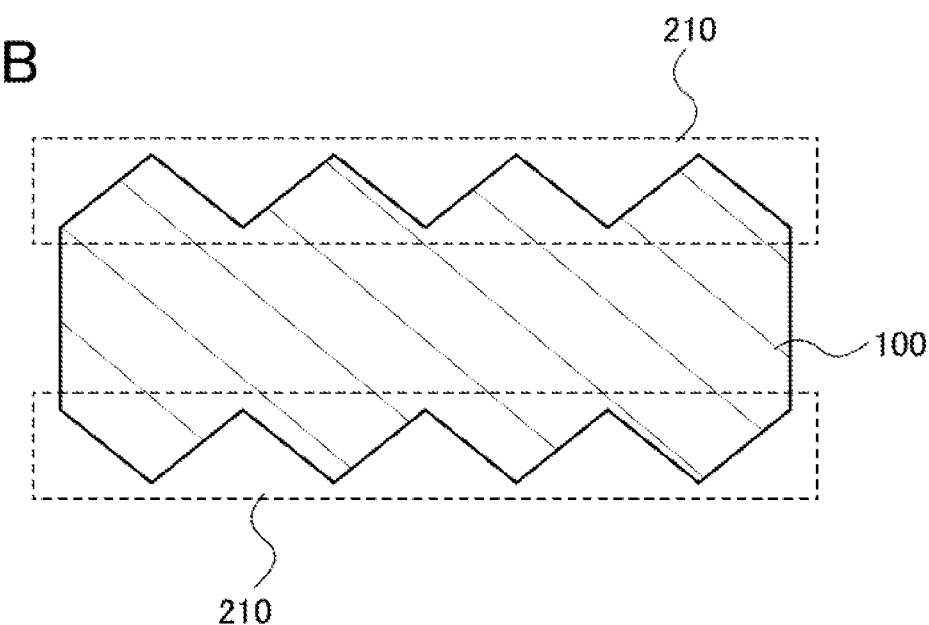
Figure 7C:
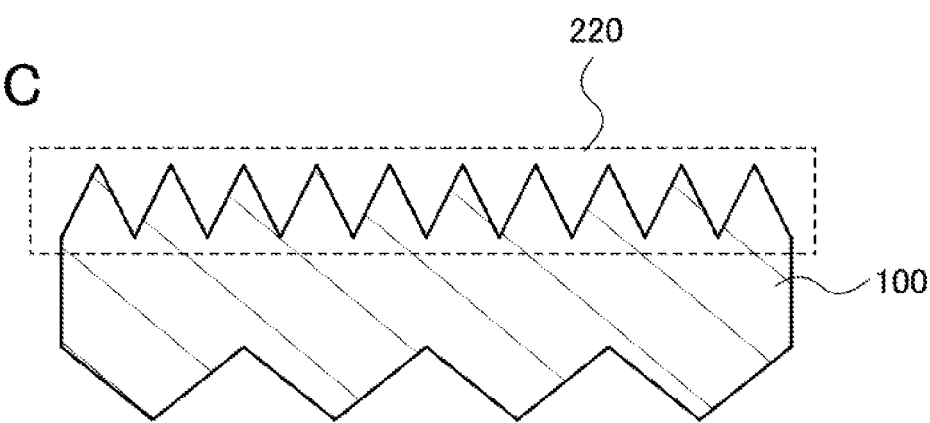

Alternatively, as illustrated in FIG. 6, the light-transmitting conductive film 380 may be, provided over the light-transmitting semiconductor layer 320 in the structure of FIG. 5. Providing the light-transmitting conductive film 380 enables the resistance loss in the light-transmitting semiconductor layer 320 to be reduced. Note that FIG. 6 illustrates a structure in which the crystalline silicon substrate 300 has unevenness; however, a structure without unevenness may be employed.

Note that in each of the structures of the photoelectric conversion devices of FIGS. 3A and 3B, FIG. 4, FIG. 5, and FIG. 6, a region referred to as the light-transmitting semiconductor layer 320 may have a stacked structure of the light-transmitting semiconductor layer and a p-type silicon semiconductor layer. When the p-type silicon semiconductor layer is provided, the carrier density in a p-type region (a portion where the light-transmitting semiconductor layer and the p-type silicon semiconductor layer are stacked) can be increased. As a result, the internal electric field can be increased, and the electric characteristics of the photoelectric conversion device can be improved. Note that since the p-type silicon semiconductor layer used here can be formed to have extremely small thickness; thus, the light loss caused by light absorption can be almost ignored.

Next, a method for manufacturing the photoelectric conversion device illustrated in FIG. 3B is described with reference to FIGS. 9A to 9C and FIGS. 10A to 10C.

A single crystal silicon substrate or a polycrystalline silicon substrate, which has n-type conductivity, can be used for the crystalline silicon substrate 300 which can be used in one embodiment of the present invention. The manufacturing method of the crystalline silicon substrate is not specifically limited. In this embodiment, a single crystal silicon substrate whose surface corresponds to the (100) plane and which is manufactured by a Magnetic Czochralski (MCZ) method is used.

Figure 9A:
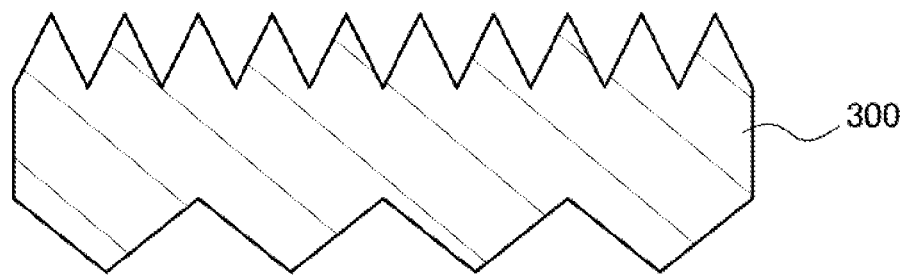
FIGS. 9A to 9C are cross-sectional views illustrating a process of a manufacturing method of a photoelectric conversion device according to one embodiment of the present invention.

Next, the surface and the back surface of the crystalline silicon substrate 300 are processed to have unevenness (see FIG. 9A). The description of FIGS. 7B and 7C in Embodiment 1 can be referred to for the details of the process for forming unevenness. Note that in the case of manufacturing the photoelectric conversion device having the structure of FIG. 3A, the process for forming unevenness may be skipped.

Figure 9B:
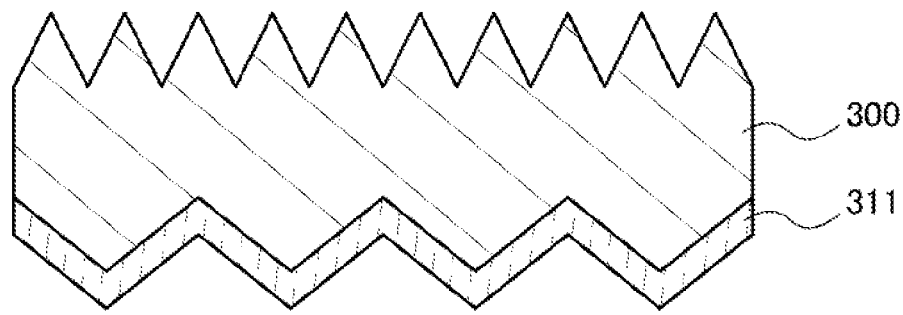

Next, the first amorphous silicon layer 311 is formed on one surface of the crystallin silicon substrate 300, which is on the opposite side of the light-receiving surface, by a plasma CVD method (see FIG. 9B). The thickness of the first amorphous silicon layer 311 is preferably greater than or equal to 3 nm and less than or equal to 50 nm. In this embodiment, the first amorphous silicon layer 311 is i-type and the film thickness is 5 nm.

An example of film formation conditions of the first amorphous silicon layer 311 is as follows: monosilane is introduced to a reaction chamber at a flow rate of greater than or equal to 5 sccm and less than or equal to 200 sccm; the pressure inside the reaction chamber is higher than or equal to 10 Pa and lower than or equal to 100 Pa; the electrode interval is greater than or equal to 15 mm and less than or equal to 40 mm; and the power density is greater than or equal to 8 mW/cm$^2$ and less than or equal to 50 mW/cm$^{-1}$.

Figure 9C:
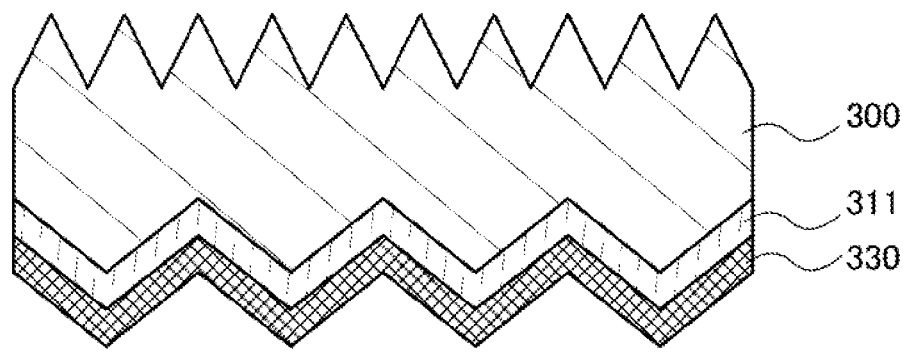

Next, the silicon semiconductor layer 330 is formed on the first amorphous silicon layer 311 (see FIG. 9C). The thickness of the silicon semiconductor layer 330 is preferably greater than or equal to 3 nm and less than or equal to 50 nm. In this embodiment, the silicon semiconductor layer 330 is an n-type microcrystalline silicon layer or an n-type amorphous silicon layer, which has a film thickness of 10 nm.

An example of film formation conditions of the silicon semiconductor layer 330 is as follows monosilane with a flow rate of greater than or equal to 1 sccm and less than or equal to 10 sccm, hydrogen with a flow rate of greater than or equal to 100 sccm and less than or equal to 5000 sccm, and hydrogen-based phosphine (0.5%) with a flow rate of greater than or equal to 5 sccm and less than or equal to 50 sccm are introduced to the reaction chamber; the pressure inside the reaction chamber is set to higher than or equal to 450 Pa and lower than or equal to 100000 Pa, preferably higher than or equal to 2000 Pa and lower than or equal to 50000 Pa; the electrode interval is set to greater than or equal to 8 mm and less than or equal to 30 mm; and the power density is set to greater than or equal to 200 in W/cm$^2$ and less than or equal to 1500 mW/cm$^2$.

Figure 10A:
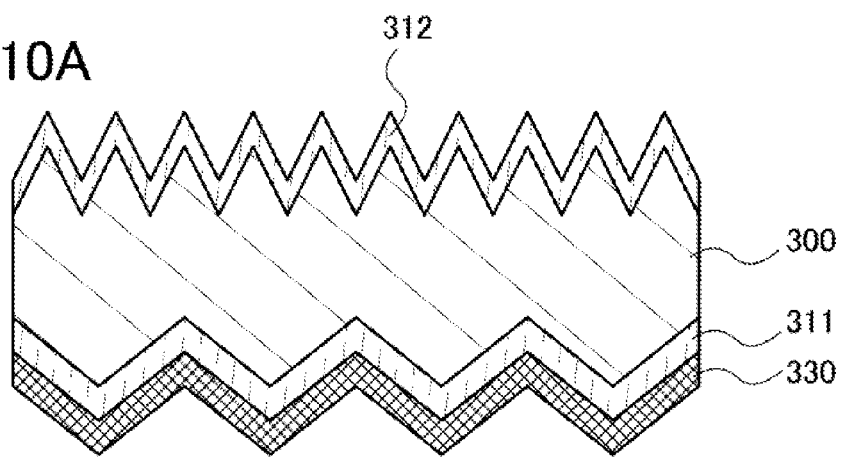
FIGS. 10A to 10C are cross-sectional views illustrating a process of a manufacturing method of a photoelectric conversion device according to one embodiment of the present invention.

Next, the second amorphous silicon layer 312 is formed over another surface of the crystalline silicon substrate 300, which is to function as a light-receiving surface, by a plasma CVD method (see FIG. 10A). The thickness of the second amorphous silicon layer 312 is preferably greater than or equal to 3 nm and less than or equal to 50 nm, and in this embodiment, the second amorphous silicon layer 312 is an i-type amorphous silicon layer with a film thickness of 5 nm. Note that the second amorphous silicon layer 312 can be formed under the same film formation conditions as those of the first amorphous silicon layer 311.

Note that in this embodiment, although an RF power source with a frequency of 13.56 MHz is used as a power source in forming the first amorphous silicon layer 311, the second amorphous silicon layer 312, and the silicon semiconductor layer 330, an RF power source with a frequency of 27.12 MHz, 60 MHz, or 100 MHz may be used instead. Furthermore, film formation may be performed by pulsed discharge as well as by continuous discharge. The implementation of pulse discharge can improve the film quality and reduce particles produced in the gas phase.

Figure 10B:
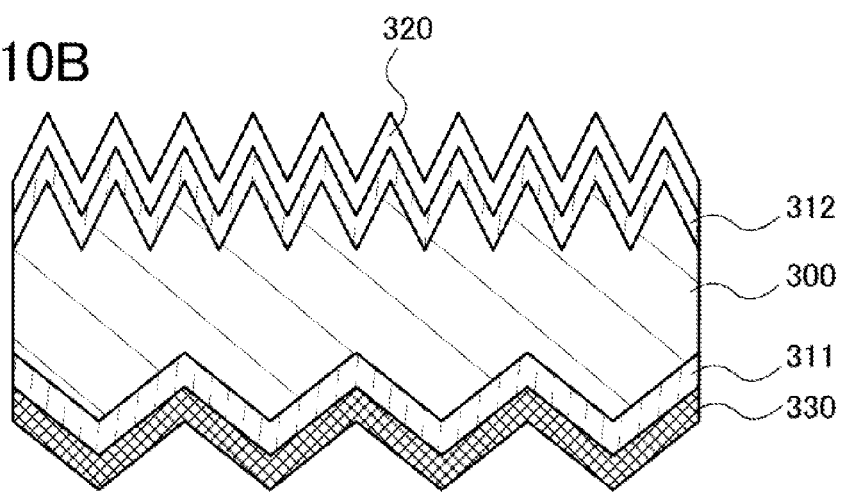

Next, the light-transmitting semiconductor layer 320 is formed over the second amorphous silicon, layer 312 (see FIG. 10B). The light-transmitting semiconductor layer 320 can be formed by co-deposition of the inorganic, compound and the organic compound. Note that a co-deposition method is a method in which vapor deposition from a plurality of evaporation sources is performed at the same time in one deposition chamber. It is preferable that deposition be performed under high vacuum. The high vacuum can be obtained by evacuation of the deposition chamber with an evacuation unit to a vacuum of about 5×10$^{-3}$ Pa or less, preferably, about 10$^{-4}$ Pa to 10$^{-6}$ Pa.

In this embodiment, the light-transmitting semiconductor layer 320 is formed by co-depositing 4-phenyl-4'-(9-phenylfluoren-9-yl)triphenylamine (abbreviation: BPAFLP) and molybdenum(VI) oxide. The thickness of the light-transmitting semiconductor layer 320 is set to 50 nm, and the weight ratio of BPAFLP to molybdenum, oxide is controlled to be 2:1 (=BPAFLP:molybdenum oxide).

Next, the first electrode 340 is formed on the silicon semiconductor layer 330. Low-resistance metals such as silver, aluminum, and copper can be used for the first electrode 340, which can be formed by a sputtering method, a vacuum evaporation method, or the like. Alternatively, the first electrode 340 may be formed using a conductive resin such as a silver paste or a copper paste by a screen printing method.

Figure 10C:
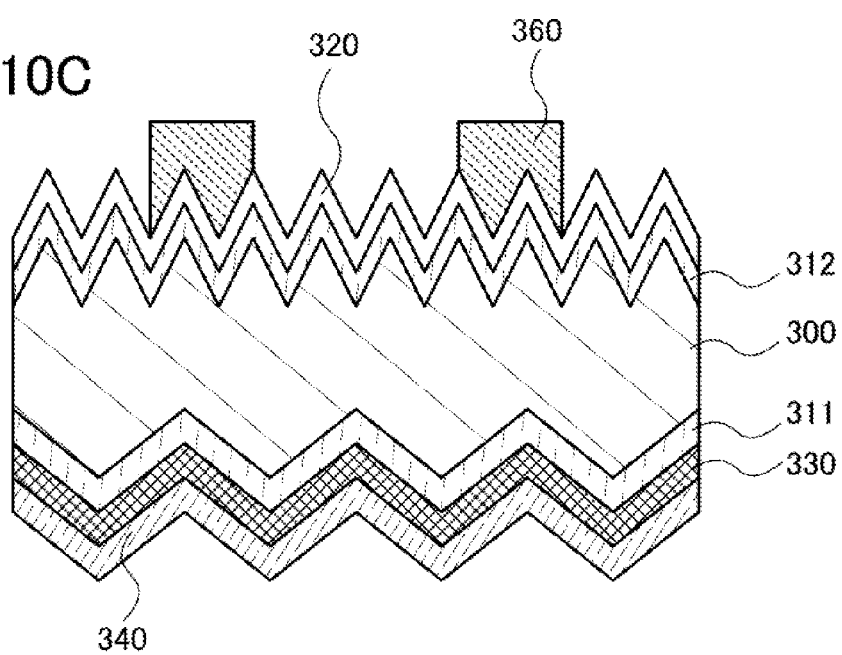

Next, the second electrode 360 is formed over the light-transmitting semiconductor layer 320 (see FIG. 10C). The second electrode 360 is a grid electrode, which is preferably formed using a conductive resin such as a silver paste, a copper paste, a nickel paste, or a molybdenum paste by a screen printing method. Further, the second electrode 360 may be a stacked layer of different materials, such as a stacked layer of a silver paste and a copper paste.

Note that the formation order of the films provided on the surface side and the back surface side of the crystalline silicon substrate 300 is not limited to the order described above as long as the structure illustrated in FIG. 10C can be obtained. For example, formation of the second amorphous silicon layer 312 may follow formation of the first amorphous silicon layer 311.

Note that in order to form the photoelectric conversion device illustrated in FIG. 4, the light-transmitting conductive film 380 may be formed over the light-transmitting semiconductor layer 320 before the second electrode 360 is formed. For the light-transmitting conductive film 380, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. In addition, the light-transmitting conductive film 380 is not limited to a single layer, and may be a stacked layer of different films. For example, a stacked layer of an indium tin oxide and a zinc oxide containing aluminum, a stacked layer of an indium tin oxide and a tin oxide containing fluorine, etc. can be used. A total film thickness is from 10 to 1000 nm inclusive.

Further, in order to form the photoelectric conversion device illustrated in FIG. 5, the formation step of the second amorphous silicon layer 312 may be skipped. In addition, the light-transmitting conductive film 380 is formed over the light-transmitting semiconductor layer 320, whereby the photoelectric conversion device illustrated in FIG. 6 can be formed.

In the above manner, the photoelectric conversion device in which the light-transmitting semiconductor layer is used for a window layer, which is one embodiment of the present invention, can be manufactured.

This embodiment can be freely combined with any of the other embodiments.

Embodiment 3

In this embodiment, the light-transmitting semiconductor layer described in Embodiment 1 and Embodiment 2 will be described.

For each of the light-transmitting semiconductor layers 120 and 320 in the photoelectric conversion devices described in Embodiment 1 and Embodiment 2, a composite material of a transition metal oxide and an organic compound can be used. Note that in this specification, the word "composite" means not only a state in which two materials are simply mixed but also a state in which a plurality of materials is mixed aid charges are transferred between the materials.

As the transition metal oxide, a transition metal oxide having an electron-accepting property can be used. Specifically, among transition metal oxides, an oxide of a metal belonging to any of Groups 4 to 8 of the periodic table is preferable. In particular, it is preferable to use vanadium oxide, niobium oxide, tantalum oxide, chromium oxide, molybdenum oxide, tungsten oxide, manganese oxide, or rhenium oxide because of their high, electron-accepting, properties. Among these, molybdenum oxide is especially preferable since it is stable in the air, has low hygroscopic property, and is easily treated.

As the organic compound, any of a variety of compounds such as an aromatic amine compound, a carbazole derivative, an aromatic hydrocarbon, a high molecular compound (e.g., an oligomer, a dendrimer, or a polymer), and a heterocyclic compound having a dibenzofuran skeleton or a dibenzothiophene skeleton can be used. As the organic compound used for the composite material, an organic compound having a high hole-transport property is used. Specifically, a substance having a hole mobility of $10^{-6}$ cm$^2$/Vs or higher is preferably used. However, any other substance whose hole-transport property is higher than the electron-transport property may be used.

In a composite material of the above-described transition metal oxide and the above-described organic compound, electrons in the highest occupied molecular orbital level (HOMO level) of the organic compound are transferred to the conduction band of the transition metal oxide, whereby interaction between the transition metal oxide and the organic compound occurs. Due to this interaction, the composite material including the transition metal oxide and the organic compound has high carrier density and has p-type semiconductor characteristics.

The organic compounds which can be used in the composite material will be specifically given below.

As the aromatic amine compounds that can be used for the composite material, the following can be given as examples: 4,4'-bis[N-(1-naphthyl)-N-phenylamino]biphenyl (abbreviation: NPB); N,N'-bis(3-methylphenyl)-N,N'-diphenyl-[1,1'-biphenyl]-4,4'-diamine (abbreviation: TPD), 4,4',4''-tris(N,N'-diphenylamino)triphenylamine (abbreviation: TDATA); 4,4',4''-tris[N-(3-methylphenyl)-N-phenylamino]triphenylamine (abbreviation: MTDATA); and N,N'-bis(spiro-9,9'-bifluoren-2-yl)-N,N'-diphenylbenzidine (abbreviation: BSPB). In addition, the following can be given: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine (abbreviation: DNTPD); 1,3,5-tris[N-(4-diphenylaminophenyl)-N-phenylamino]benzene (abbreviation: DPA3B); 4-phenyl-4'-(9-phenyl fluoren-9-yl) triphenylamine (abbreviation: BPAFLP); and 4,4'-bis[N-(9,9-dimethylfluoren-2-yl)-N-phenylamino]biphenyl (abbreviation: DFLDPBi).

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as a carbazole derivative which can be used for the composite material, 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10- phenylanthracene (abbreviation: CzPA), 1,4-bis[4-(N-carbazolyl)phenyl]-2,3,5,6-tetraphenylbenzene, or the like can be used.

As the aromatic hydrocarbon that can be used for the composite material, the following can be given as examples: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation; DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. The aromatic hydrocarbon which has a hole mobility of $1\times10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

The organic compound used for the composite material may be a heterocyclic compound having a dibenzofuran skeleton or a dibenzothiophene skeleton.

The organic compound that can be used for the composite material may be a high molecular compound, and the following can be given as examples: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl)methacrylamide](abbieviation: PTPDMA); poly[N,N'-bis(4-butylphenyl)-N,N'-bis(phenyl)benzidine](abbreviation: Poly-TPD); and the like.

The light-transmitting semiconductor layer described in this embodiment has high light-transmitting property with respect to light in a wavelength range, which is absorbed by crystalline silicon. Thus, the light-transmitting semiconductor layer can be formed thick as compared with the thickness of the silicon semiconductor layer in which case it is used for the window layer, and thus the resistance loss can be reduced.

Figure 11:
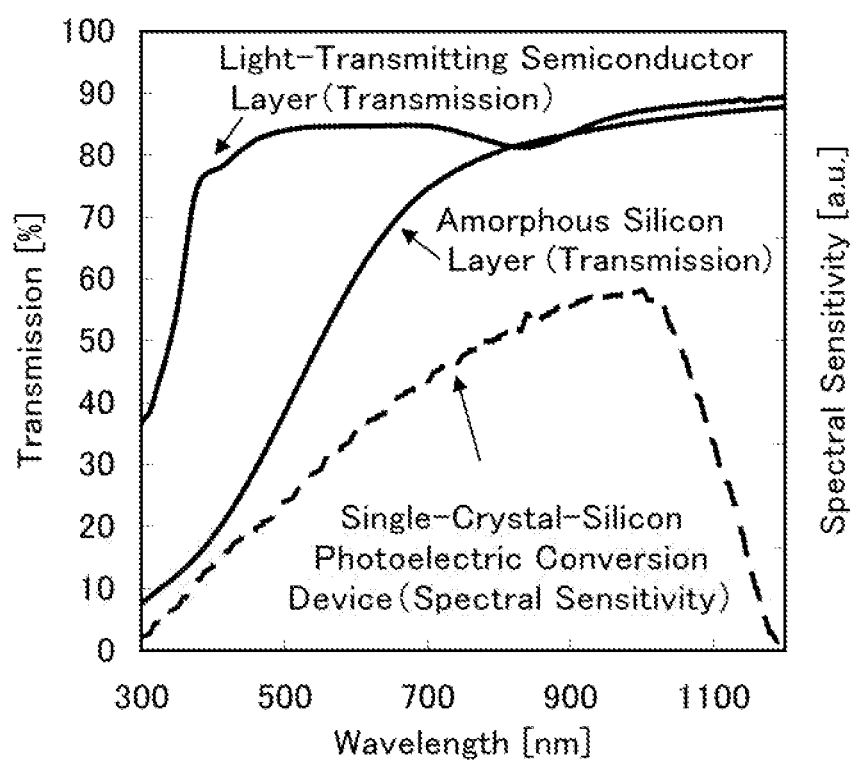
FIG. 11 shows the spectral transmission of a light-transmitting semiconductor layer and an amorphous silicon layer and the spectral sensitivity characteristics of a single crystal silicon photoelectric conversion device.

FIG. 11 shows the spectra transmissions of a light-transmitting semiconductor layer (with a thickness of 57 nm) and an amorphous silicon layer (with a thickness of 10 nm) and the spectral sensitivity characteristics of the general single-crystal-silicon photoelectric conversion device. The light-transmitting semiconductor layer is obtained by co-deposition of 4-phenyl-4'-(9-phenylfluoren-9-yl)triphenylamine (abbreviation: BPAFLP) and molybdenum(VI) oxide. As shown in FIG. 11, whereas the light-transmitting semiconductor layer in this embodiment has a high light-transmitting property in the wide wavelength range, the amorphous silicon layer has high absorptance on a shorter wavelength side than the visible light range. For example, in the case of the conventional photoelectric conversion device in which an amorphous silicon film is used for the window layer, absorption of light on the shorter wavelength side than the visible light is a loss. On the other hand, in the case of using the light-transmitting semiconductor layer for the window layer, light in the wavelength range, which is absorbed by an amorphous silicon film, can be efficiently used for photoelectric conversion.

A variety of methods can be used for forming the light-transmitting semiconductor layer, whether the method is a dry process or, a wet process. As a dry method, a co-deposition method, by which a plurality of evaporation materials are vaporized from a plurality of evaporation sources to perform deposition, and the like are given as examples. As a wet method, a composition having, a composite material is adjusted by a sol-gel method or the like, and deposition can be performed using an ink-jet method or a spin-coating method.

When the above-described light-transmitting semiconductor layer is used for a window layer of a photoelectric conversion device, the light loss caused by light absorption in the window layer is reduced, and the electric characteristics of the photoelectric conversion device can be improved.

This embodiment can be freely combined with any of the other embodiments.

This application is based on Japanese Patent Application serial no. 2011-034621 filed with Japan Patent Office on Feb. 21, 2011, the entire contents of which are hereby incorporated by reference.

What is claimed is:

1. A photoelectric conversion device comprising:
a first electrode;
a crystalline silicon substrate on the first electrode, wherein a conductivity type of the crystalline silicon substrate is n-type;
a light-transmitting semiconductor layer on a first surface of the crystalline silicon substrate, wherein a conductivity type of the light-transmitting semiconductor layer is p-type;
a light-transmitting conductive layer on the light-transmitting semiconductor layer; and
at least one second electrode on the light-transmitting conductive layer,
wherein the first electrode is provided on an entire area of a second surface of the crystalline silicon substrate,
wherein the light-transmitting semiconductor layer comprises an organic compound and an inorganic compound,
wherein the inorganic compound is an oxide of metal belonging to any of Group 4 to Group 8 in the periodic table, and
wherein the organic compound is any one of an aromatic amine compound, a carbazole derivative, an aromatic hydrocarbon, a high molecular compound, and a heterocyclic compound having a dibenzofuran skeleton or a dibenzothiophene skeleton.

2. The photoelectric conversion device according to claim 1, wherein the inorganic compound is any one of a vanadium oxide, a niobium oxide, a tantalum oxide, a chromium oxide, a molybdenum oxide, a tungsten oxide, a manganese oxide, and a rhenium oxide.

3. The photoelectric conversion device according to claim 1, wherein the light-transmitting conductive layer comprises a material selected from the group consisting of indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, and graphene.

4. The photoelectric conversion device according to claim 1, wherein the first electrode comprises at least one of silver and copper.

5. The photoelectric conversion device according to claim 1, wherein the first surface of the crystalline silicon substrate has first projecting portions each having an aspect ratio greater than or equal to 3 and less than or equal to 15, and wherein the second surface of the crystalline silicon substrate has second projecting portions each having an aspect ratio greater than or equal to 0.5 and less than or equal to 3.

6. A photoelectric conversion device comprising:
a first electrode;
a semiconductor layer comprising silicon on the first electrode;
a first amorphous silicon layer on the semiconductor layer comprising silicon;
a crystalline silicon substrate on the first amorphous silicon layer, wherein a conductivity type of the crystalline silicon substrate is n-type;
a second amorphous silicon layer on a first surface of the crystalline silicon substrate;
a light-transmitting semiconductor layer on the second amorphous silicon layer, wherein a conductivity type of the light-transmitting semiconductor layer is p-type;
a light-transmitting conductive layer on the light-transmitting semiconductor layer; and
at least one second electrode on the light-transmitting conductive layer,
wherein a second surface of the crystalline silicon substrate is covered with the first electrode, the semiconductor layer comprising silicon, and the first amorphous silicon layer,
wherein the light-transmitting semiconductor layer comprises an organic compound and an inorganic compound,
wherein the inorganic compound is an oxide of metal belonging to any of Group 4 to Group 8 in the periodic table, and
wherein the organic compound is any one of an aromatic amine compound, a carbazole derivative, an aromatic hydrocarbon, a high molecular compound, and a heterocyclic compound having a dibenzofuran skeleton or a dibenzothiophene skeleton.

7. The photoelectric conversion device according to claim 6, wherein a conductivity type of the semiconductor layer comprising silicon is n-type conductivity types of the first and second amorphous silicon layers are i-type.

8. The photoelectric conversion device according to claim 6, wherein the inorganic compound is any one of a vanadium oxide, a niobium oxide, a tantalum oxide, a chromium oxide, a molybdenum oxide, a tungsten oxide, a manganese oxide, and a rhenium oxide.

9. The photoelectric conversion device according to claim 6, wherein the light-transmitting conductive layer comprises a material selected from the group consisting of indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, and graphene.

10. The photoelectric conversion device according to claim 6, wherein the first electrode comprises at least one of silver and copper.

11. The photoelectric conversion device according to claim 6, wherein the semiconductor layer comprising silicon is one of an n-type microcrystalline silicon layer and an n-type amorphous silicon layer.

12. The photoelectric conversion device according to claim 6, wherein the first surface of the crystalline silicon substrate has first projecting portions each having an aspect ratio greater than or equal to 3 and less than or equal to 15, and wherein the second surface of the crystalline silicon substrate has second projecting portions each having an aspect ratio greater than or equal to 0.5 and less than or equal to 3.

13. A photoelectric conversion device comprising:
a first electrode;
a semiconductor layer comprising silicon on the first electrode;
an amorphous silicon layer on the semiconductor layer comprising silicon;
a crystalline silicon substrate on the amorphous silicon layer, wherein a conductivity type of the crystalline silicon substrate is n-type;
a light-transmitting semiconductor layer on a first surface of the crystalline silicon substrate, wherein a conductivity type of the light-transmitting semiconductor layer is p-type;
a light-transmitting conductive layer on the light-transmitting semiconductor layer; and
at least one second electrode on the light-transmitting conductive layer,
wherein a second surface of the crystalline silicon substrate is covered with the first electrode, the semiconductor layer comprising silicon, and the amorphous silicon layer,
wherein the light-transmitting semiconductor layer comprises an organic compound and an inorganic compound,
wherein the inorganic compound is an oxide of metal belonging to any of Group 4 to Group 8 in the periodic table, and
wherein the organic compound is any one of an aromatic amine compound, a carbazole derivative, an aromatic hydrocarbon, a high molecular compound, and a heterocyclic compound having a dibenzofuran skeleton or a dibenzothiophene skeleton.

14. The photoelectric conversion device according to claim 13, wherein a conductivity type of the semiconductor layer comprising silicon is n-type and a conductivity type of the amorphous silicon layer is i-type.

15. The photoelectric conversion device according to claim 13, wherein the inorganic compound is any one of a vanadium oxide, a niobium oxide, a tantalum oxide, a chromium oxide, a molybdenum oxide, a tungsten oxide, a manganese oxide, and a rhenium oxide.

16. The photoelectric conversion device according to claim 13, wherein the light-transmitting conductive layer comprises a material selected from the group consisting of indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, and graphene.

17. The photoelectric conversion device according to claim 13, wherein the first electrode comprises at least one of silver and copper.

18. The photoelectric conversion device according to claim 13, wherein the semiconductor layer comprising silicon is one of an n-type microcrystalline silicon layer and an n-type amorphous silicon layer.

19. The photoelectric conversion device according to claim 13,
wherein the first surface of the crystalline silicon substrate has first projecting portions each having an aspect ratio greater than or equal to 3 and less than or equal to 15, and wherein the second surface of the crystalline silicon substrate has second projecting portions each having an aspect ratio greater than or equal to 0.5 and less than or equal to 3.

* * * * *